United States Patent
Hsu et al.

(10) Patent No.: US 10,117,340 B2
(45) Date of Patent: Oct. 30, 2018

(54) MANUFACTURING METHOD OF PACKAGE SUBSTRATE WITH METAL ON CONDUCTIVE PORTIONS

(71) Applicant: Phoenix Pioneer technology Co., Ltd., Hsinchu County (TW)

(72) Inventors: Che-Wei Hsu, Hsinchu County (TW); Shih-Ping Hsu, Hsinchu County (TW); Pao-Hung Chou, Hsinchu County (TW)

(73) Assignee: Phoenix Pioneer technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/973,522

(22) Filed: May 7, 2018

(65) Prior Publication Data
US 2018/0255651 A1     Sep. 6, 2018

Related U.S. Application Data

(62) Division of application No. 15/002,346, filed on Jan. 20, 2016, now Pat. No. 9,992,879.

(30) Foreign Application Priority Data

Jul. 29, 2015   (CN) .......................... 2015 1 0453954

(51) Int. Cl.
    *H01K 3/10*     (2006.01)
    *H05K 3/46*     (2006.01)
    *H01L 23/12*    (2006.01)

(52) U.S. Cl.
    CPC .......... *H05K 3/4682* (2013.01); *H01L 23/12* (2013.01); *H05K 3/4647* (2013.01); *Y10T 29/49165* (2015.01)

(58) Field of Classification Search
    CPC .... H05K 3/4682; H05K 3/4647; H05K 3/205; H01L 23/12; G01R 1/06727; Y10T 29/49155; Y10T 29/49165
    USPC .............. 29/830, 846, 852; 174/257; 438/14
    See application file for complete search history.

(56) References Cited

U.S. PATENT DOCUMENTS

| | | |
|---|---|---|
| 4,712,161 A | 12/1987 | Pryor et al. |
| 5,784,212 A | 7/1998 | Hornbeck |
| 5,945,203 A | 8/1999 | Soane |
| 6,222,136 B1 | 4/2001 | Appelt et al. |
| 6,255,126 B1 * | 7/2001 | Mathieu ............. G01R 1/06727 438/14 |
| 6,423,906 B2 | 7/2002 | Wang |

(Continued)

*Primary Examiner* — Donghai D Nguyen
(74) *Attorney, Agent, or Firm* — CKC & Partners Co., Ltd.

(57) ABSTRACT

A manufacturing method of a package substrate includes forming a patterned first dielectric layer on a carrier; forming a first wiring layer on a first surface of the first dielectric layer facing away from the carrier, a wall surface facing one of the openings of the first dielectric layer, and the carrier in one of the openings; forming a first conductive pillar layer on the first wiring layer on the first surface; forming a second dielectric layer on the first surface, the first wiring layer, and the openings, wherein the first conductive pillar layer is exposed from the second dielectric layer; forming a second wiring layer on the exposed first conductive pillar layer and the second dielectric layer; forming an electrical pad layer on the second wiring layer; and forming a third dielectric layer on the second dielectric layer and the second wiring layer.

5 Claims, 6 Drawing Sheets

(56) References Cited

U.S. PATENT DOCUMENTS

| | | | |
|---|---|---|---|
| 6,555,908 B1 | 4/2003 | Eichelberger et al. | |
| 6,662,442 B1 * | 12/2003 | Matsui | H05K 3/205 |
| | | | 174/257 |
| 7,257,892 B2 | 8/2007 | Sato et al. | |
| 9,449,933 B2 | 9/2016 | Huang et al. | |
| 2001/0010303 A1 | 8/2001 | Caron et al. | |
| 2002/0157864 A1 | 10/2002 | Koyama et al. | |
| 2004/0053489 A1 | 3/2004 | Kata et al. | |
| 2004/0074088 A1 | 4/2004 | Nakamura et al. | |
| 2004/0226827 A1 | 11/2004 | Matsuda et al. | |
| 2006/0255102 A1 | 11/2006 | Snyder et al. | |
| 2007/0141757 A1 | 6/2007 | Nomura | |
| 2008/0136041 A1 | 6/2008 | Kotake et al. | |
| 2009/0046441 A1 | 2/2009 | Funaya et al. | |
| 2009/0242261 A1 | 10/2009 | Takenaka et al. | |
| 2010/0147560 A1 | 6/2010 | Kaneko | |
| 2010/0147574 A1 | 6/2010 | Kaneko et al. | |
| 2010/0289155 A1 | 11/2010 | Sunohara et al. | |
| 2010/0314254 A1 | 12/2010 | Kodani | |
| 2012/0037667 A1 | 2/2012 | Eggen et al. | |
| 2014/0233199 A1 | 8/2014 | Munakata et al. | |
| 2014/0318846 A1 | 10/2014 | Hayashi et al. | |
| 2015/0194378 A1 | 7/2015 | Tsang | |
| 2015/0194405 A1 | 7/2015 | Liang et al. | |
| 2015/0279777 A1 | 10/2015 | Hsu | |
| 2015/0371965 A1 | 12/2015 | Hu | |
| 2015/0373833 A1 | 12/2015 | Baek et al. | |
| 2015/0382463 A1 | 12/2015 | Kim et al. | |
| 2016/0165722 A1 | 6/2016 | Hsu et al. | |
| 2017/0034908 A1 | 2/2017 | Hsu et al. | |

* cited by examiner

MANUFACTURING METHOD OF PACKAGE SUBSTRATE WITH METAL ON CONDUCTIVE PORTIONS

RELATED APPLICATIONS

This is a divisional application of the U.S. application Ser. No. 15/002,346, filed Jan. 20, 2016, which claims priority to China Application Serial Number 201510453954.2, filed Jul. 29, 2015, all of which are herein incorporated by reference.

BACKGROUND

Field of Invention

The present invention relates to a package substrate and a manufacturing method of the package substrate.

Description of Related Art

A package substrate is used to support an integrated circuit (IC) die and is referred to as a carrier. The package substrate has inner lines and electrical contacts, such that the electrical contacts on two opposite sides of the package substrate can respectively electrically connect to the semiconductor die and a printed circuit board (PCB). As a result, the semiconductor die and the PCB may transmit signals through the inner lines of the package substrate. With the development of semiconductor manufacturing technology, designers demand increasingly higher standards with respect to wire layout density, transmission speed, and signal disturbance, and thus package substrates have been extensively utilized in electronic products. For example, package substrates may be used in smartphones, tablet computers, network and communication solutions, laptop computers, etc.

In manufacturing a typical package substrate, a patterned conductive layer is formed on a carrier, such that the conductive layer has openings that expose the carrier. Thereafter, a copper pillar layer is formed on the conductive layer, and a dielectric layer is utilized to cover the conductive layer and the openings. As a result, after the carrier is removed, the entire conductive layer is exposed. However, only a portion of the conductive layer is utilized to electrically connect to a semiconductor die. If the conductive layer is directly connected to the electrical contacts of the semiconductor die, they will be easily separated due to the poor bonding force therebetween, thereby reducing reliability. In order to improve the bonding force between the package substrate and the semiconductor die, a nickel layer and a gold layer are often electroplated on the conductive layer. However, due to process limitations, the nickel layer and the gold layer are formed on the entire exposed conductive layer, and cannot be formed only on portions of the conductive layer corresponding to the electrical contacts of the semiconductor die. Therefore, the cost of the package substrate may be significantly increased.

SUMMARY

An aspect of the present invention is to provide a package substrate.

According to an embodiment of the present invention, a package substrate includes a first dielectric layer, a first wiring layer, a first conductive pillar layer, a second dielectric layer, a second wiring layer, an electrical pad layer, and a third dielectric layer. The first dielectric layer has a first surface, a second surface opposite to the first surface, a plurality of openings through the first and second surfaces, and a wall surface facing at least one of the openings. The first wiring layer is located on the first surface and the wall surface. A portion of the first wiring layer on an edge of the wall surface adjacent to the second surface extends in a direction away from the wall surface. The first conductive pillar layer is located on a portion of the first wiring layer that is on the first surface. The second dielectric layer is located on the first surface, the first wiring layer, and in the openings. The first conductive pillar layer is exposed from the second dielectric layer. The second wiring layer is located on the exposed first conductive pillar layer and the second dielectric layer. The electrical pad layer is located on the second wiring layer. The third dielectric layer is located on the second dielectric layer and the second wiring layer. The electrical pad layer is exposed from the third dielectric layer.

Another aspect of the present invention is to provide a manufacturing method of a package substrate.

According to an embodiment of the present invention, a manufacturing method of a package substrate includes the following steps. (a) A patterned first dielectric layer is formed on a carrier, such that the first dielectric layer has a plurality of openings. (b) A first wiring layer is formed on a first surface of the first dielectric layer facing away from the carrier, a wall surface facing at least one of the openings, and the carrier in at least one of the openings. (c) A first conductive pillar layer is formed on a portion of the first wiring layer that is on the first surface. (d) A second dielectric layer is formed on the first surface, the first wiring layer, and the openings, and the first conductive pillar layer is exposed from the second dielectric layer. (e) A second wiring layer is formed on the exposed first conductive pillar layer and the second dielectric layer. (f) An electrical pad layer is formed on the second wiring layer. (g) A third dielectric layer is formed on the second dielectric layer and the second wiring layer, and the electrical pad layer is exposed from the third dielectric layer.

In the aforementioned embodiments of the present invention, the first dielectric layer having the openings is formed on the carrier. Thereafter, the first wiring layer is formed on the first surface of the first dielectric layer, the wall surface that faces at least one of the openings, and the carrier that is in at least one of the openings. As a result, after the carrier is removed, only certain portions of the first wiring layer are exposed from the second surface of the first dielectric layer, and the positions of such portions of the exposed first wiring layer correspond to the positions of the electrical contacts of a semiconductor die. In the subsequent manufacturing process, since only the above portions of the first wiring layer corresponding to the positions of the electrical contacts of the semiconductor die are exposed from the second surface of the first dielectric layer, it is possible to electroplate a nickel layer and a gold layer only on these portions of the first wiring layer. Accordingly, the costs associated with the nickel layer and the gold layer can be significantly reduced in the package substrate of the present invention.

An aspect of the present invention is to provide a package substrate.

According to an embodiment of the present invention, a package substrate includes a first dielectric layer, a first wiring layer, a first conductive pillar layer, a second dielectric layer, a second wiring layer, a second conductive pillar layer, and a third dielectric layer. The first dielectric layer has a first surface, a second surface opposite to the first surface, a plurality of openings through the first and second surfaces, and a wall surface facing at least one of the openings. The first wiring layer is located on the first surface and the wall surface. A portion of the first wiring layer on an edge of the wall surface adjacent to the second surface extends in a direction away from the wall surface. The first conductive pillar layer is located on a portion of the first wiring layer that is on the first surface. The second dielectric layer is located on the first surface, the first wiring layer, and in the openings. The first conductive pillar layer is exposed from the second dielectric layer. The second wiring layer is located on the exposed first conductive pillar layer and the second dielectric layer. The second conductive pillar layer is located on the second wiring layer. The third dielectric layer is located on the second dielectric layer and the second wiring layer. The second conductive pillar layer is exposed from the third dielectric layer.

Another aspect of the present invention is to provide a manufacturing method of a package substrate.

According to an embodiment of the present invention, a manufacturing method of a package substrate includes the following steps. (a) A patterned first dielectric layer is formed on a carrier, such that the first dielectric layer has a plurality of openings. (b) A first wiring layer is formed on a first surface of the first dielectric layer facing away from the carrier, a wall surface facing at least one of the openings, and the carrier in at least one of the openings. (c) A first conductive pillar layer is formed on a portion of the first wiring layer that is on the first surface. (d) A second dielectric layer is formed on the first surface, the first wiring layer, and the openings, and the first conductive pillar layer is exposed from the second dielectric layer. (e) A second wiring layer is formed on the exposed first conductive pillar layer and the second dielectric layer. (f) A second conductive pillar layer is formed on the second wiring layer. (g) A third dielectric layer is formed on the second dielectric layer and the second wiring layer, and the second conductive pillar layer is exposed from the third dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
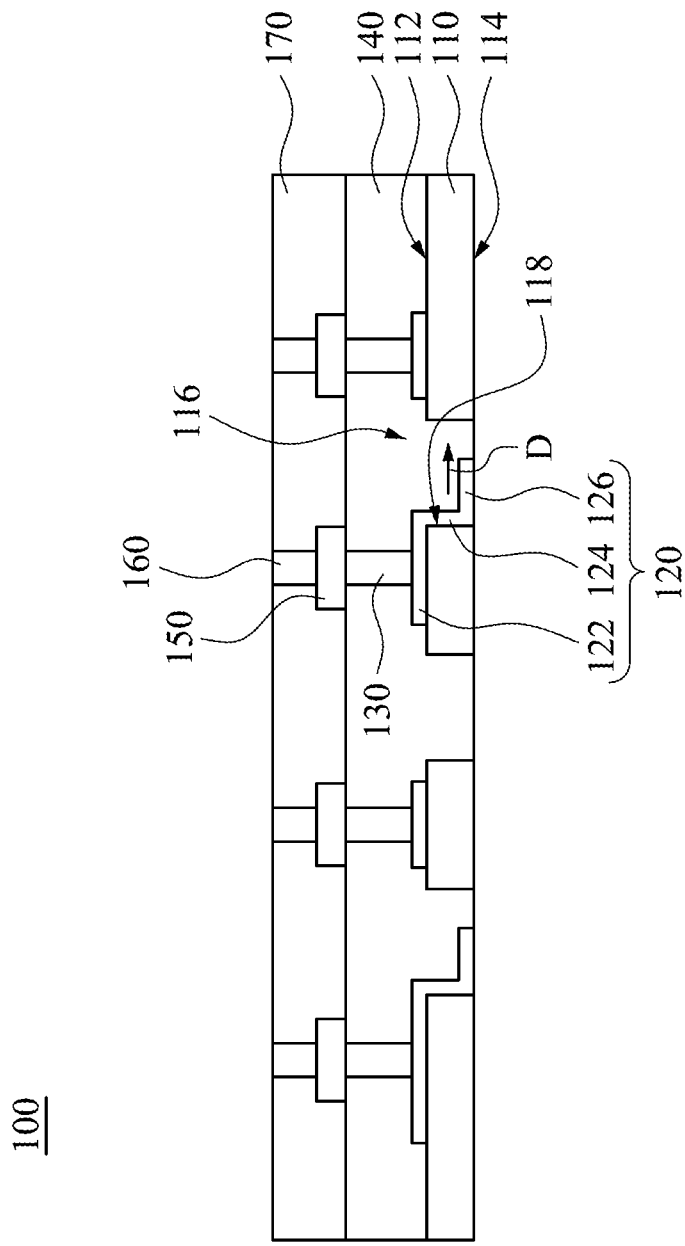
FIG. 1 is a cross-sectional view of a package substrate according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a package substrate 100 according to one embodiment of the present invention. As shown in FIG. 1, the package substrate 100 is a coreless substrate and includes a first dielectric layer 110, a first wiring layer 120, a first conductive pillar layer 130, a second dielectric layer 140, a second wiring layer 150, an electrical pad layer 160, and a third dielectric layer 170. In the following description, the shape and the material of the electrical pad layer 160 may be respectively the same as the shape and the material of first conductive pillar layer 130, so that the electrical pad layer 160 may be referred to as a second conductive pillar layer. In other words, element 160 may be referred to as an "electrical pad layer" or a "second conductive pillar layer" in the following description. The first dielectric layer 110 has a first surface 112, a second surface 114 opposite to the first surface 112, plural openings 116, and a wall surface 118. The openings 116 pass through the first and second surfaces 112, 114. The wall surface 118 faces at least one of the openings 116. The first wiring layer 120 is located on the first surface 112 of the first dielectric layer 110 and the wall surface 118 of at least one of the openings 116. Moreover, the first wiring layer 120 on the edge of the wall surface 118 adjacent to the second surface 114 extends in a direction D away from the wall surface 118, such that the first wiring layer 120 is step-shaped.

The first conductive pillar layer 130 is located on the first wiring layer 120, that is, on a portion of the first wiring layer 120 that is on the first surface 112 of the first dielectric layer 110. The second dielectric layer 140 is located on the first surface 112 of the first dielectric layer 110, the first wiring layer 120, and in the openings 116 of the first dielectric layer 110. The top of the first conductive pillar layer 130 is exposed from the second dielectric layer 140, and the second wiring layer 150 is located on an exposed portion of the first conductive pillar layer 130 and the second dielectric layer 140. The electrical pad layer 160 is located on the second wiring layer 150. The third dielectric layer 170 is located on the second dielectric layer 140 and the second wiring layer 150, and the top of the electrical pad layer 160 is exposed from the third dielectric layer 170.

As a result of such a design, in the package substrate 100 of the present invention, only a portion of the first wiring layer 120 is exposed from the second surface 114 of the first dielectric layer 110, and the portion of the first wiring layer 120 exposed from the second surface 114 may be utilized to electrically connect to a semiconductor die. That is to say, in the package substrate 100, only a portion of the first wiring layer 120 desired to connect the semiconductor die is exposed, thereby reducing the costs associated with a nickel layer and a gold layer that are electroplated on the first wiring layer 120. In addition, the step-shaped first wiring layer 120 is a three-dimensional connection trace, and it is helpful to the circuit layout of the package substrate 100.

In this embodiment, the first dielectric layer 110, the second dielectric layer 140, and the third dielectric layer 170 may be made of a material including epoxy, silicon oxide, or nitrogen oxide. The first dielectric layer 110, the second dielectric layer 140, and the third dielectric layer 170 may be made of the same material, but the present invention is not limited in this regard. The first and second wiring layers 120, 150, the first conductive pillar layer 130, and the electrical pad layer 160 may be made of a material including copper or other conductive metals, such that the first wiring layer 120, the first conductive pillar layer 130, the second wiring layer 150, and the electrical pad layer 160 may be electrically connected with each other by contact.

Furthermore, the openings 116 and the orthogonal projection of the first conductive pillar layer 130 on the first dielectric layer 110 are spaced apart. In other words, the first conductive pillar layer 130 is not aligned with the openings 116, such that the position of the first conductive pillar layer 130 is not limited to the positions of the openings 116. Hence, flexibility is provided with respect to the circuit layout of the package substrate 100.

In this embodiment, the first wiring layer 120 includes a first sub-portion 122, a second sub-portion 124, and a third sub-portion 126. The first sub-portion 122 is located on the first surface 112 of the first dielectric layer 110. The second sub-portion 124 has opposite first and second ends, and the first end is connected to an end of the first sub-portion 122. The second sub-portion 124 is located on the wall surface 118. The third sub-portion 126 is connected to the second end of the second sub-portion 124. The third sub-portion 126 extends in the direction D away from the wall surface 118. The extending direction of the first sub-portion 122 on the first surface 112 is opposite to the extending direction D of the third sub-portion 126, and thus the first, second, and third sub-portions 122, 124, 126 are formed in a Z-shaped arrangement. Moreover, the first sub-portion 122 can be utilized to electrically connect to the first conductive pillar layer 130, and the third sub-portion 126 can be utilized to electrically connect to a semiconductor die.

Figure 2:
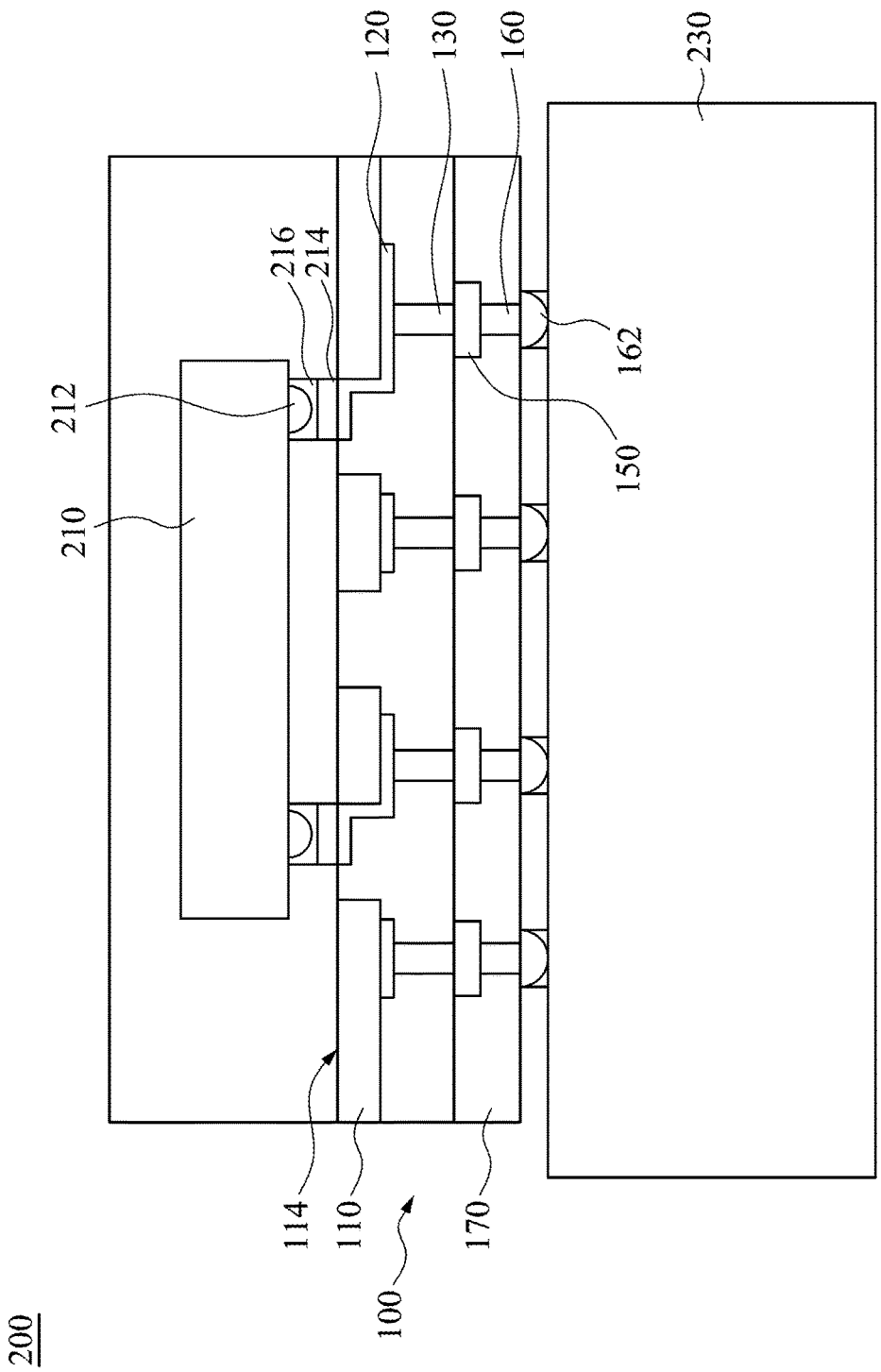
FIG. 2 is a cross-sectional view of an electronic device, in which the package substrate shown in FIG. 1 is used therein.

FIG. 2 is a cross-sectional view of an electronic device 200, in which the package substrate 100 shown in FIG. 1 is used therein. The electronic device 200 includes the package substrate 100, a semiconductor die 210, and a printed circuit board 230. The semiconductor die 210 is disposed on the package substrate 100, and the package substrate 100 is disposed on the printed circuit board 230. The semiconductor die 210 has plural electrical contacts 212. The positions of the first wiring layer 120 exposed from the first dielectric layer 110 correspond to the positions of the electrical contacts 212 of the semiconductor die 210, such that the first wiring layer 120 is electrically connected to the electrical contacts 212 of the semiconductor die 210. In this embodiment, a nickel layer 214 and a gold layer 216 may be electroplated on the first wiring layer 120 to increase the bonding force between the first wiring layer 120 and the electrical contact 212. In addition, plural conductive structures 162 may be formed on portions of the electrical pad layer 160 that are exposed from the third dielectric layer 170 to electrically connect to the printed circuit board 230. The conductive structures 162 may be a ball grid array (BGA), but are not limited in this regard. As a result, the package substrate 100 may be regarded as a medium to transmit signals between the semiconductor die 210 and the printed circuit board 230.

In the package substrate 100, only portions of the first wiring layer 120 are exposed from the second surface 114 of the first dielectric layer 110. Since only portions of the first wiring layer 120 corresponding to the positions of the electrical contacts 212 of the semiconductor die 210 are exposed from the first dielectric layer 110, the nickel layer 214 and the gold layer 216 can be formed only on these portions of the first wiring layer 120. Accordingly, the costs associated with the nickel layer 214 and the gold layer 216 can be significantly reduced in the package substrate 100 of the present invention.

In this embodiment, the second surface 114 of the first dielectric layer 110 and the portion of the first wiring layer 120 that extends in a direction away from the wall surface 118 are coplanar, such that the semiconductor die 210 can be securely disposed on the second surface 114 of the first dielectric layer 110.

It is to be noted that the connection relationships and materials of the elements described above will not be repeated in the following description, and only aspects related to the manufacturing method of the package substrate 100 will be described.

Figure 3:
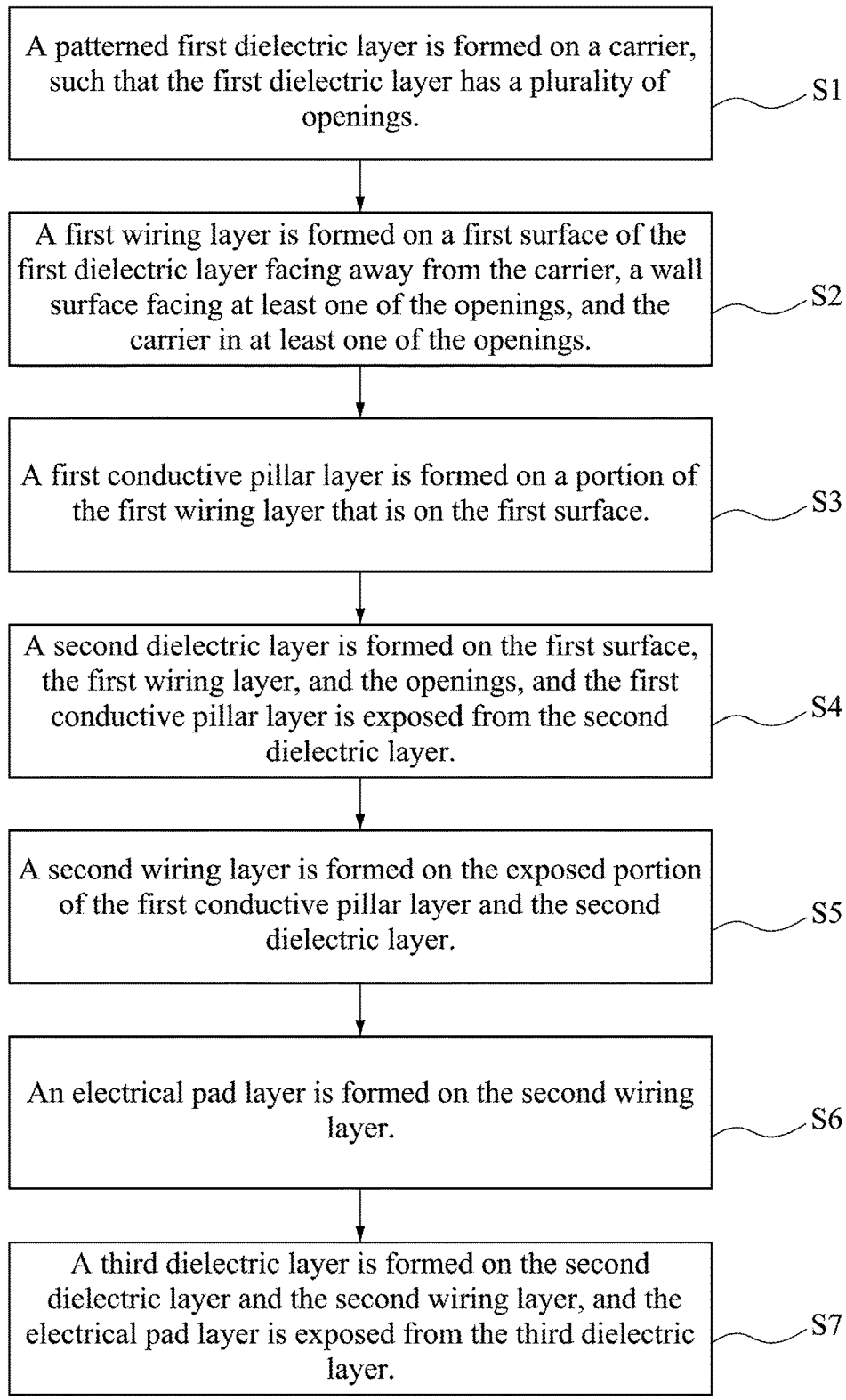
FIG. 3 is a flow chart of a manufacturing method of a package substrate according to one embodiment of the present invention.

FIG. 3 is a flow chart of a manufacturing method of a package substrate according to one embodiment of the present invention. The manufacturing method of the package substrate includes a number of steps as outlined below. First, in step S1, a patterned first dielectric layer is formed on a carrier, such that the first dielectric layer has a plurality of openings. Thereafter, in step S2, a first wiring layer is formed on a first surface of the first dielectric layer facing away from the carrier, a wall surface facing at least one of the openings, and the carrier in at least one of the openings. Subsequently, in step S3, a first conductive pillar layer is formed on a portion of the first wiring layer that is on the first surface. Next, in step S4, a second dielectric layer is formed on the first surface, the first wiring layer, and the openings, and the first conductive pillar layer is exposed from the second dielectric layer. Thereafter, in step S5, a second wiring layer is formed on the exposed portion of the first conductive pillar layer and the second dielectric layer. Afterwards, in step S6, an electrical pad layer is formed on the second wiring layer. Finally, in step S7, a third dielectric layer is formed on the second dielectric layer and the second wiring layer, and the electrical pad layer is exposed from the third dielectric layer.

In the following description, the aforesaid steps in the manufacturing method of the package substrate will be described in detail.

Figure 4:
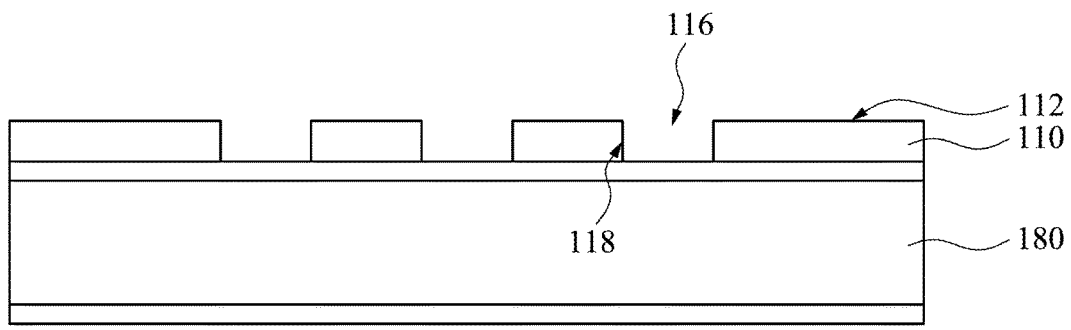
FIG. 4 is a cross-sectional view of a carrier and a first dielectric layer according to one embodiment of the present invention.

FIG. 4 is a cross-sectional view of a carrier 180 and the first dielectric layer 110 according to one embodiment of the present invention. The first dielectric layer 110 may be formed on the surface of the carrier 180, and a patterning process is performed on the first dielectric layer 110, such that the first dielectric layer 110 is patterned to have the openings 116. The patterning process may include exposure, development, and etching processes in photolithography.

Figure 5:
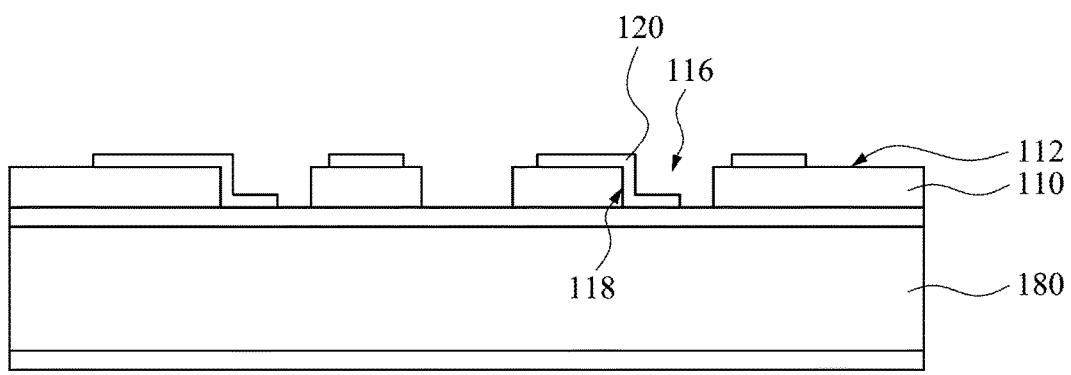
FIG. 5 is a cross-sectional view of a first wiring layer after being formed on the first dielectric layer shown in FIG. 4.

FIG. 5 is a cross-sectional view of the first wiring layer 120 after being formed on the first dielectric layer 110 shown in FIG. 4. As shown in FIG. 4 and FIG. 5, the first dielectric layer 110 has the first surface 112 facing away from the carrier 180. After the patterned first dielectric layer 110 is formed on the carrier 180, the first wiring layer 120 may be formed on the first surface 112 of the first dielectric layer 110, the wall surface 118 facing at least one of the openings 116, and a portion of the carrier 180 that is in at least one of the openings 116. In this embodiment, the first wiring layer 120 may be formed by electroless plating, dry film photoresist laminating, patterning, and electroplating in sequence, but the present invention is not limited in this regard. For example, a sputtering process or evaporation process may also be utilized to form the first wiring layer 120.

Figure 6:
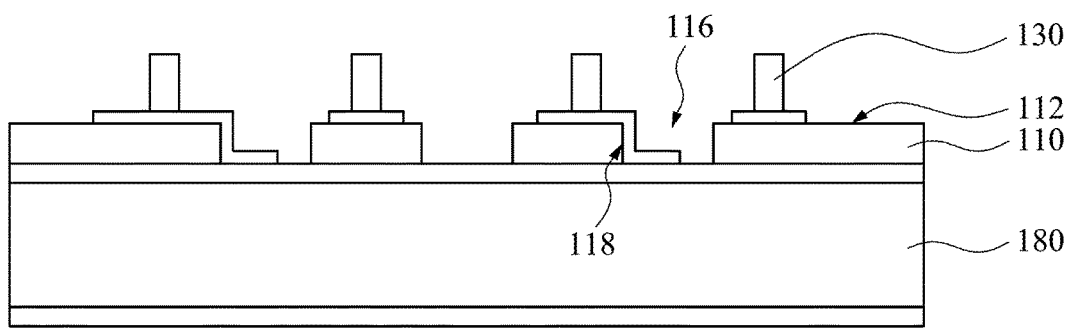
FIG. 6 is a cross-sectional view of a first conductive pillar layer after being formed on the first wiring layer shown in FIG. 5.

FIG. 6 is a cross-sectional view of the first conductive pillar layer 130 after being formed on the first wiring layer 120 shown in FIG. 5. As shown in FIG. 5 and FIG. 6, after the first wiring layer 120 is formed, the first conductive pillar layer 130 may be formed on a portion of the first wiring layer 120 that is on the first surface 112 of the first dielectric layer 110. In this embodiment, the first conductive pillar layer 130 may be formed by dry film photoresist laminating, patterning, and electroplating in sequence, but the present invention is not limited in this regard.

Figure 7:
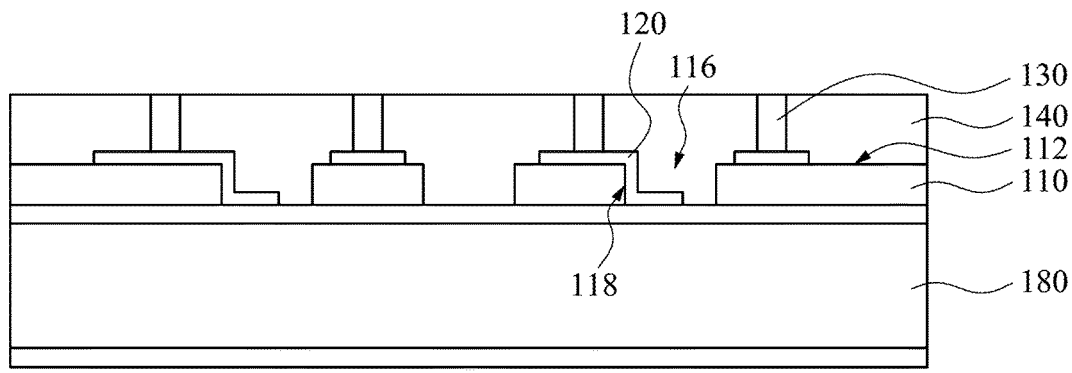
FIG. 7 is a cross-sectional view of a second dielectric layer after being formed on the first dielectric layer and the first wiring layer shown in FIG. 6.

FIG. 7 is a cross-sectional view of the second dielectric layer 140 after being formed on the first dielectric layer 110 and the first wiring layer 120 shown in FIG. 6. After the first conductive pillar layer 130 is formed on the first wiring layer 120, the second dielectric layer 140 may be formed on the first surface 112 of the first dielectric layer 110, the first wiring layer 120, and in the openings 116 of the first dielectric layer 110. The first conductive pillar layer 130 is exposed from the second dielectric layer 140. In manufacturing the second dielectric layer 140, the second dielectric layer 140 may be utilized to cover the first surface 112 of the first dielectric layer 110, the first wiring layer 120, the openings 116 of the first dielectric layer 110, and the first conductive pillar layer 130. Thereafter, the surface of the second dielectric layer 140 is ground to expose the first conductive pillar layer 130. In this embodiment, the second dielectric layer 140 may be formed by molding, but the present invention is not limited in this regard.

Figure 8:
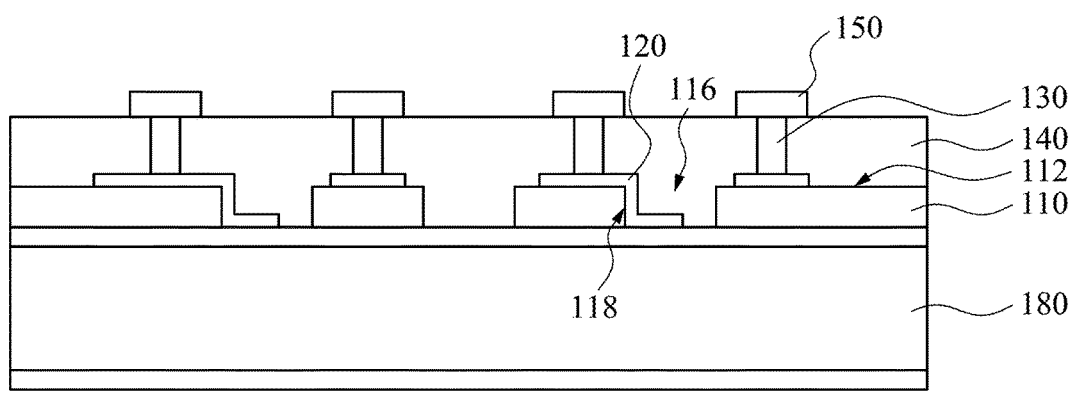
FIG. 8 is a cross-sectional view of a second wiring layer after being formed on the first conductive pillar layer shown in FIG. 7.
Figure 9:
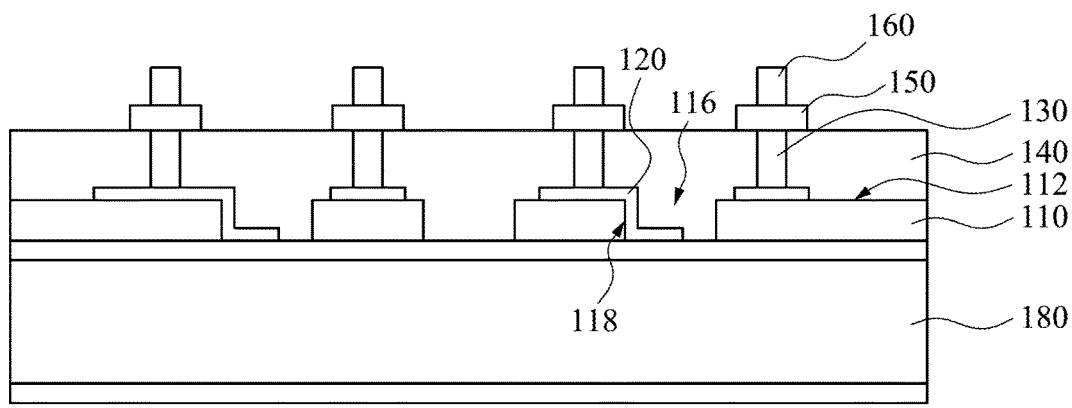
FIG. 9 is a cross-sectional view of an electrical pad layer after being formed on the second wiring layer shown in FIG. 8.

FIG. 8 is a cross-sectional view of the second wiring layer 150 after being formed on the first conductive pillar layer 130 shown in FIG. 7. FIG. 9 is a cross-sectional view of the electrical pad layer 160 after being formed on the second wiring layer 150 shown in FIG. 8. As shown in FIG. 8 and FIG. 9, after the first conductive pillar layer 130 is exposed from the second dielectric layer 140, the second wiring layer 150 may be formed on the exposed first conductive pillar layer 130 and the second dielectric layer 140. Afterwards, the electrical pad layer 160 may be formed on the second wiring layer 150. In this embodiment, the forming method of the second wiring layer 150 and the electrical pad layer 160 may be the same as the forming method of the first conductive pillar layer 130, but the present invention is not limited in this regard.

Figure 10:
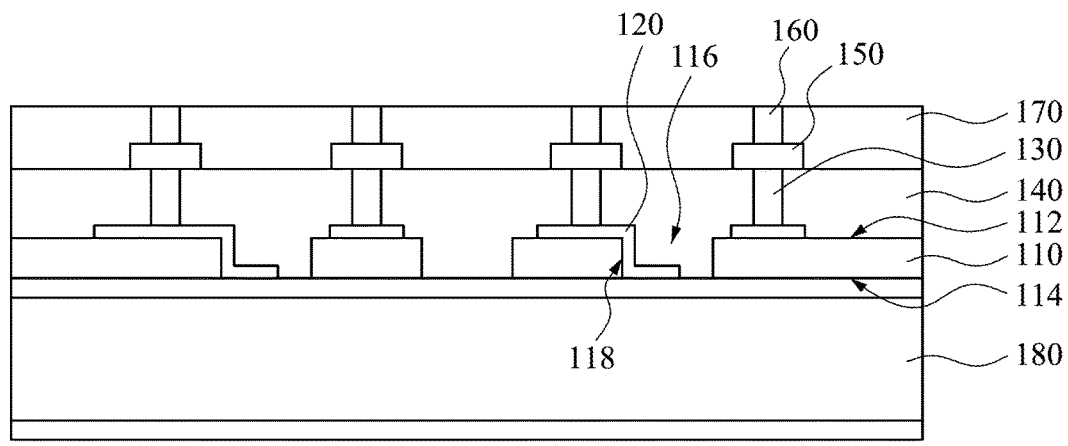
FIG. 10 is a cross-sectional view of a third dielectric layer after being formed on the second dielectric layer shown in FIG. 9.
Figure 11:
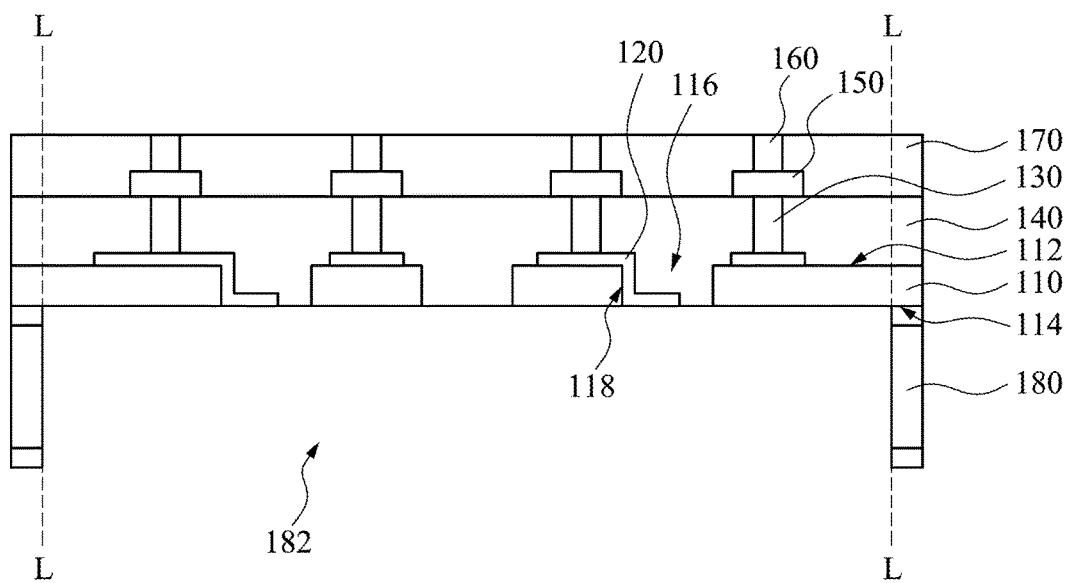
FIG. 11 is a cross-sectional view of the carrier shown in FIG. 10 after being etched.

FIG. 10 is a cross-sectional view of the third dielectric layer 170 after being formed on the second dielectric layer 140 shown in FIG. 9. FIG. 11 is a cross-sectional view of the carrier 180 shown in FIG. 10 after being etched. As shown in FIG. 10 and FIG. 11, after the electrical pad layer 160 is formed on the second wiring layer 150, the third dielectric layer 170 may be formed on the second dielectric layer 140 and the second wiring layer 150, and the electrical pad layer 160 is exposed from the surface of the third dielectric layer 170. The first dielectric layer 110 has the second surface 114 opposite to the first surface 112. After the third dielectric layer 170 is formed, the carrier 180 may be etched, such that the second surface 114 of the first dielectric layer 110 and the portion of the first wiring layer 120 that is on an end of the wall surface 118 adjacent to the second surface 114 are exposed. The etched carrier 180 has a hollow region 182, and a semiconductor die may be bonded to the first wiring layer 120 that is in the hollow region 182.

After the carrier 180 is etched to form the hollow region 182, the residual carrier 180 (i.e., the portion of the carrier 180 remaining after being etched) and edges of the first, second, and third dielectric layers 110, 140, 170 may be cut off along line L-L. As a result, the package substrate 100 shown in FIG. 1 may be obtained.

In the manufacturing method of the package substrate, the first dielectric layer 110 having the openings 116 is formed on the carrier 180. Thereafter, the first wiring layer 120 is formed on the first surface 112 of the first dielectric layer 110, the wall surface 118 that faces at least one of the openings 116, and the carrier 180 that is in at least one of the openings 116. As a result, after the carrier 180 is removed, only a portion of the first wiring layer 120 is exposed from the second surface 114 of the first dielectric layer 110. In the subsequent manufacturing process, since only portions of the first wiring layer 120 corresponding to the positions of the electrical contacts of a semiconductor die are exposed from the second surface 114 of the first dielectric layer 110, a nickel layer and a gold layer can be electroplated only on these portions of the first wiring layer 120. Hence, the costs associated with the nickel layer and the gold layer can be effectively reduced in the package substrate of the present invention.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A manufacturing method of a package substrate, comprising:
    (a) forming a patterned first dielectric layer on a carrier, such that the first dielectric layer has a plurality of openings;
    (b) forming a first wiring layer on a first surface of the first dielectric layer facing away from the carrier, a wall surface facing at least one of the openings, and the carrier in at least one of the openings;
    (c) forming a first conductive pillar layer on a portion of the first wiring layer that is on the first surface;
    (d) forming a second dielectric layer on the first surface, the first wiring layer, and the openings, wherein the first conductive pillar layer is exposed from the second dielectric layer;
    (e) forming a second wiring layer on the exposed first conductive pillar layer and the second dielectric layer;
    (f) forming an electrical pad layer on the second wiring layer; and
    (g) forming a third dielectric layer on the second dielectric layer and the second wiring layer, wherein the electrical pad layer is exposed from the third dielectric layer.

2. The manufacturing method of the package substrate of claim 1, wherein the first dielectric layer has a second surface opposite to the first surface, and the manufacturing method further comprises:

etching the carrier, thereby exposing the second surface and a portion of the first wiring layer that is on an end of the wall surface adjacent to the second surface.

3. The manufacturing method of the package substrate of claim 2, further comprising:
   cutting off the etched carrier and edges of the first, second, and third dielectric layers.

4. The manufacturing method of the package substrate of claim 1, wherein step (d) comprises:
   covering the first surface, the first wiring layer, the openings, and the first conductive pillar layer with the second dielectric layer; and
   grinding the second dielectric layer, thereby exposing the first conductive pillar layer.

5. A manufacturing method of a package substrate, comprising:
   (a) forming a patterned first dielectric layer on a carrier, such that the first dielectric layer has a plurality of openings;
   (b) forming a first wiring layer on a first surface of the first dielectric layer facing away from the carrier, a wall surface facing at least one of the openings, and the carrier in at least one of the openings;
   (c) forming a first conductive pillar layer on a portion of the first wiring layer that is on the first surface;
   (d) forming a second dielectric layer on the first surface, the first wiring layer, and the openings, wherein the first conductive pillar layer is exposed from the second dielectric layer;
   (e) forming a second wiring layer on the exposed first conductive pillar layer and the second dielectric layer;
   (f) forming a second conductive pillar layer on the second wiring layer; and
   (g) forming a third dielectric layer on the second dielectric layer and the second wiring layer, wherein the second conductive pillar layer is exposed from the third dielectric layer.

* * * * *